(12) United States Patent
Chang

(10) Patent No.: US 11,776,848 B2
(45) Date of Patent: Oct. 3, 2023

(54) SEMICONDUCTOR DEVICE AND METHODS FOR MANUFACTURING THEREOF

(71) Applicant: Changxin Memory Technologies, Inc., Anhui (CN)

(72) Inventor: Chih-Wei Chang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 378 days.

(21) Appl. No.: 17/199,328

(22) Filed: Mar. 11, 2021

(65) Prior Publication Data

US 2021/0202315 A1 Jul. 1, 2021

Related U.S. Application Data

(63) Continuation of application No. PCT/CN2019/105588, filed on Sep. 12, 2019.

(30) Foreign Application Priority Data

Sep. 14, 2018 (CN) .................... 201811075278.X
Sep. 14, 2018 (CN) .................... 201821514032.3

(51) Int. Cl.
*H01L 21/768* (2006.01)
*H01L 23/48* (2006.01)

(52) U.S. Cl.
CPC .... *H01L 21/76898* (2013.01); *H01L 21/7682* (2013.01); *H01L 21/76831* (2013.01);
(Continued)

(58) Field of Classification Search
CPC ........... H01L 21/76898; H01L 21/7682; H01L 21/76831; H01L 21/7684; H01L 21/76877; H01L 24/32; H01L 23/481
See application file for complete search history.

(56) References Cited

U.S. PATENT DOCUMENTS

2012/0037412 A1* 2/2012 Reinmuth ............. H01L 23/481
174/262
2012/0139127 A1* 6/2012 Beyne ............... H01L 21/76898
257/E21.586

(Continued)

FOREIGN PATENT DOCUMENTS

CN 102623433 A 8/2012
CN 107680953 A 2/2018

(Continued)

OTHER PUBLICATIONS

PCT International Search Report and the Written Opinion dated Dec. 11, 2019, issued in related International Application No. PCT/CN2019/105588 (7 pages).

*Primary Examiner* — Jaehwan Oh
*Assistant Examiner* — John M Parker
(74) *Attorney, Agent, or Firm* — Sheppard Mullin Richter & Hampton LLP

(57) ABSTRACT

A semiconductor device and related manufacturing methods are provided. The semiconductor device includes one interconnection structure including: a substrate; a first insulating dielectric layer underneath a lower surface of the substrate; a second insulating dielectric layer on an upper surface of the substrate; a first connecting pad disposed within the first insulating dielectric layer; a metal connection member penetrating through a portion of the second insulating dielectric layer, the substrate and a portion of the first insulating dielectric layer to connect the first connecting pad; and a second connecting pad disposed within the second insulating dielectric layer and connecting the metal connection member. The metal connection member may be a Through-Silicon Via (TSV). The device includes a confined air gap surrounding the metal connection member, which improves the performance and reliability of the device.

20 Claims, 18 Drawing Sheets

(52) U.S. Cl.
    CPC ........ *H01L 23/481* (2013.01); *H01L 21/7684* (2013.01); *H01L 21/76877* (2013.01)

(56) References Cited

U.S. PATENT DOCUMENTS

| | | | | |
|---|---|---|---|---|
| 2013/0115769 | A1* | 5/2013 | Yu | H01L 21/76898 |
| | | | | 257/E21.597 |
| 2014/0264921 | A1* | 9/2014 | Gao | H01L 23/481 |
| | | | | 257/774 |
| 2014/0374916 | A1* | 12/2014 | Bu | H01L 23/481 |
| | | | | 257/774 |
| 2018/0166319 | A1 | 6/2018 | Park et al. | |
| 2020/0258772 | A1 | 8/2020 | Hsieh | |

FOREIGN PATENT DOCUMENTS

| | | |
|---|---|---|
| CN | 107731744 A | 2/2018 |
| CN | 208753310 U | 4/2019 |

\* cited by examiner

SEMICONDUCTOR DEVICE AND METHODS FOR MANUFACTURING THEREOF

CROSS-REFERENCE TO RELATED APPLICATIONS

This application is a continuation application of International Patent Application No. PCT/CN2019/105588, filed on Sep. 12, 2019, which is based on and claims priority of the Chinese Patent Application Nos. 201811075278.X and 201821514032.3, both filed on Sep. 14, 2018. The above-referenced applications are incorporated herein by reference in their entirety.

TECHNICAL FIELD

This disclosure relates generally to the field of semiconductor technologies and, more specifically, to a semiconductor device and related manufacturing methods.

BACKGROUND

With rapid development in semiconductor technology, semiconductor chips are increasingly integrated to achieve faster speeds, larger storage capacities and more diverse functionalities. A higher level of integration leads to smaller feature size of the semiconductor device.

Three-dimensional (3D) integrated circuit (IC) is manufactured by advanced technologies which stack circuits of different functions into an integrated circuit of a three-dimensional structure. Compared to a two-dimensional (2D) IC, a 3D IC formed by the stacking technologies shortens signal transmission paths, thus offering a faster operation speed. Thus, 3D ICs can better satisfy the ever increasing demands in semiconductor industry for more powerful devices with smaller sizes, lower power consumption and more diverse functionalities.

Through-Silicon Via (TSV) technology, which connects stacked circuits in a 3D IC, is a critical technology. TSV creates shorter signal transmission paths between circuits in a 3D IC, thus allowing the device to operate at a higher speed. Additionally, TSV may reduce the parasitic effect, power consumption, size and weight of a device, and it does not limit the number of circuits that can be stacked in a 3D ICs.

However, semiconductor devices manufactured by existing techniques have a number of limitations, including unsatisfactory resistance-capacitance (RC) delay and low reliability.

SUMMARY

In view of the limitations of existing technologies described above, this disclosure provides a semiconductor device and related manufacturing methods that address at least some of the aforementioned limitations.

One aspect of this inventive concept is directed to a semiconductor device, comprising at least one interconnection structure. The interconnection structure may comprise: a substrate having an upper surface and a lower surface opposing the upper surface; a first insulating dielectric layer underneath the lower surface of the substrate; a second insulating dielectric layer on the upper surface of the substrate; a first connecting pad disposed within the first insulating dielectric layer; a metal connection member penetrating through a first portion of the second insulating dielectric layer, the substrate, and a second portion of the first insulating dielectric layer to connect the first connecting pad, the metal connection member surrounded by an annular hollow space. The annular hollow space may have a first surface exposing the metal connection member, a second surface exposing the substrate, and a bottom surface.

The interconnection structure may further include a dielectric liner layer, a liner cover, and a second connecting pad. The dielectric liner layer may be located within the annular hollow space and cover the first surface, the second surface and the bottom surface. The dielectric liner layer may have a thickness that is smaller than half of a gap between the first surface and the second surface, thereby forming an air gap. The liner cover may be located on the dielectric liner layer and hermetically close the air gap that surrounds the metal connection member. The second connecting pad may be disposed within the second insulating dielectric layer and on the liner cover. The second connecting pad may be connecting the metal connection member.

In some embodiments, the substrate may comprise one or more of silicon, germanium, silicon-germanium, silicon carbide and gallium arsenide.

In some embodiments, the first insulating dielectric layer and the second insulating dielectric layer may comprise one or more of silicon nitride, silicon dioxide and silicon oxynitride.

In some embodiments, the first connecting pad, the metal connection member and the second connecting pad may comprise one or more of tungsten, copper, aluminum, silver, platinum and alloys thereof.

In some embodiments, the metal connection member may be a Through-Silicon Via (TSV).

In some embodiments, the annular hollow space may penetrate through the first portion of the second insulating dielectric layer, the substrate, and the second portion of the first insulating dielectric layer.

In some embodiments, a distance from the first surface to the second surface along a direction perpendicular to the first surface and the second surface may range from 0.1 µm to 5 µm.

Another aspect of this inventive concept is directed to a semiconductor device manufacturing method. The method may comprise: providing a substrate having a lower surface and an upper surface opposing the lower surface. A first insulating dielectric layer may be disposed underneath the lower surface, a first connecting pad may be disposed within the first insulating dielectric layer, and a second insulating dielectric layer may be disposed on the upper surface.

The method may further include disposing a metal connection member in the substrate. The metal connection member may penetrate through a first portion of the second insulating dielectric layer, the substrate, and a second portion of the first insulating dielectric layer to connect the first connecting pad. The method may further include forming an annular hollow space surrounding the metal connection member. The annular hollow space may have a first surface exposing the metal connection member, a second surface exposing the substrate, and a bottom surface.

The method may further include forming a dielectric liner layer within the annular hollow space. The dielectric liner layer may cover the first surface, the second surface and the bottom surface, and have a thickness that is smaller than half of a gap between the first surface and the second surface along a direction perpendicular to the first surface and the second surface, thereby forming an air gap. The method may further include forming a liner cover on the dielectric liner layer to hermetically close the air gap, thereby forming a spacer surrounding the metal connection member; and disposing a second connecting pad within the second insulating dielectric layer, on the liner cover and connecting the metal connection member.

In some embodiments, the disposing a metal connection member in the substrate may comprise: etching the first portion of the second insulating dielectric layer, the substrate and the second portion of the first insulating dielectric layer with an aid of a mask to form a via exposing an upper surface of the first connecting pad; and depositing a metallic material within the via to form the metal connection member.

In some embodiments, the metallic material may be deposited by sputtering or electroplating.

In some embodiments, the first connecting pad, the metal connection member and the second connecting pad comprise one or more of tungsten, copper, aluminum, silver, platinum, and alloys thereof.

In some embodiments, the metal connecting member may be a TSV.

In some embodiments, the forming an annular hollow space may comprise: etching the first portion of the second insulating dielectric layer, the substrate and the second portion of the first insulating dielectric layer with an aid of a mask to form the annular hollow space surrounding the metal connection member. The annular hollow space may expose an upper surface of the first connecting pad.

In some embodiments, a distance from the first surface to the second surface along a direction perpendicular to the first surface and the second surface may range from 0.1 μm to 5 μm.

In some embodiments, the dielectric liner layer may be formed by atomic layer deposition (ALD).

In some embodiments, the liner cover may be formed by depositing an insulating dielectric material over an upper part of the annular hollow space, so as to close the annular hollow space having the dielectric liner layer covering the first surface, the second surface and the bottom surface.

In some embodiments, the liner cover may be formed by depositing the insulating dielectric material by plasma enhanced chemical vapor deposition (PECVD).

In some embodiments, the spacer may comprise one or more of silicon nitride, silicon dioxide and silicon oxynitride.

Another aspect of this inventive concept is directed to a semiconductor device manufacturing method. The method may comprise: providing a substrate having a lower surface and an upper surface opposing the lower surface. A first insulating dielectric layer may be disposed underneath the lower surface, a first connecting pad may be disposed within the first insulating dielectric layer, and a second insulating dielectric layer may be disposed on the upper surface. The method may further include disposing a metal connection member in the substrate, the metal connection member penetrating through a first portion of the second insulating dielectric layer, the substrate, and a second portion of the first insulating dielectric layer to connect the first connecting pad; forming an annular hollow space surrounding the metal connection member, the annular hollow space having a first surface exposing the metal connection member, a second surface exposing the substrate, and a bottom surface; forming a dielectric layer within the annular hollow space to cover the first surface, the second surface and the bottom surface, and continuing to grow the dielectric layer to form a liner cover to close the annular hollow space, thereby forming an spacer which confines therein an air gap and surrounds the metal connection member; and disposing a second connecting pad within the second insulating dielectric layer, the second connecting pad located on the liner cover and connecting the metal connection member.

In some embodiments, the first connecting pad, the metal connecting member, and the second connecting pad may comprise one or more of tungsten, copper, aluminum, silver, platinum, and alloys thereof. The metal connection member may be a TSV.

The air gap in the interconnection structure of the semiconductor device effectively reduces the parasitic capacitance and RC delays of the semiconductor device. As a result, the operating speed and reliability of the device may be substantially improved. In addition, with the methods of this inventive concept, a uniform air gap can be formed in the semiconductor device, which can further improve the reliability of the device.

BRIEF DESCRIPTION OF THE DRAWINGS

The accompanying drawings, which are incorporated and constitute a part of the description, illustrate embodiments consistent with this inventive concept and, together with the description, serve to explain the disclosed principles. It is apparent that these drawings present only some embodiments of this inventive concept and those of ordinary skill in the art may obtain drawings of other embodiments from them without exerting any creative effort.

Figure 1:
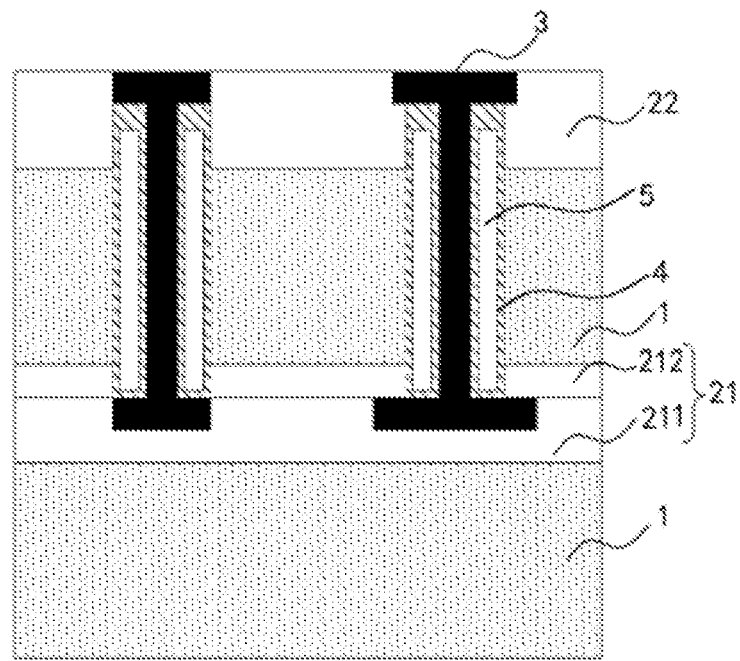
FIG. 1 is a schematic cross-sectional view of a semiconductor device in accordance with one embodiment of this inventive concept.

LIST OF REFERENCE NUMERALS IN DRAWINGS 1 substrate
21 first insulating dielectric layer
211 first portion of first insulating dielectric layer
212 second portion of first insulating dielectric layer
22 second insulating dielectric layer
221 first portion of second insulating dielectric layer
222 second portion of second insulating dielectric layer
223 third insulating dielectric layer
224 dielectric layer
23 trench
3 metal conductor
31 first connecting pad
32 metal connection member
33 second connecting pad
4 spacer
41 dielectric liner layer
42 liner cover
5 air gap
61 first mask layer 62 second mask layer
71 via
72 annular hollow space
721 first surface
722 second surface
723 bottom surface

DETAILED DESCRIPTION OF THE
EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this inventive concept and to fully convey the concepts of the embodiments to others skilled in the art.

In addition, the described features, structures, and characteristics may be combined in any suitable manner in one or more embodiments. In the following detailed description, many specific details are set forth to provide a more thorough understanding of this inventive concept. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

As used herein, the term "semiconductor device" may generally refer to a solid-state device including one or more semiconductor materials. Examples of semiconductor devices may include, among others, logic devices, memory devices and diodes. Furthermore, the term "semiconductor device" may refer to a finished device or to an assembly or other structure at various stages of processing before becoming a finished device. Depending upon the context in which it is used, the term "substrate" may refer to a wafer-level substrate or to a singularized, die-level substrate. A person having ordinary skill in the relevant art will recognize that suitable steps of the methods described herein can be performed at the wafer-level or the die-level. Furthermore, unless indicated otherwise in the context, structures disclosed herein can be formed using conventional semiconductor manufacturing techniques. Materials can be deposited using, for example, chemical vapor deposition (CVD), physical vapor deposition (PVD), atomic layer deposition (ALD), spin coating, and/or other suitable techniques. Similarly, materials can be removed using, for example, plasma etching, wet etching, chemical-mechanical planarization or other suitable techniques.

Herein, the terms "upper", "lower" and the like are used only in a relative sense or with reference to the orientation of the described item in general use and are not intended to be limiting. The terms "first," "second," and the like, if and where used herein, do not denote any order, quantity, or importance, but rather are used to distinguish one element from another.

FIG. 1 is a schematic cross-sectional view of a semiconductor device in accordance with one embodiment of this inventive concept. As shown in FIG. 1, the semiconductor device may include at least one interconnection structure (two interconnection structures are shown in FIG. 1 as an example). The semiconductor device will be described below in details to explain this inventive concept. As shown in FIG. 1, the interconnection structure may include a substrate 1, a first insulating dielectric layer 21, a second insulating dielectric layer 22, a metal conductor 3 and a spacer 4. The substrate 1 may have an upper surface and a lower surface opposing the upper surface. The first insulating dielectric layer 21 and the second insulating dielectric layer 22 may be respectively stacked on the two opposing surfaces of the substrate 1. That is, the first insulating dielectric layer 21 may be disposed underneath the lower surface of the substrate 1, and the second insulating dielectric layer 22 may be disposed on the upper surface of the substrate 1.

The metal conductor 3 may include a first connecting pad 31 disposed within the first insulating dielectric layer 21, a second connecting pad 33 disposed within the second insulating dielectric layer 22, and a metal connection member 32 (31, 32, and 33 shown in FIG. 2L) penetrating through the substrate 1 and connecting the first connecting pad 31 and the second connecting pad 33. The metal connecting member 32 may be a Through-Silicon Via (TSV). The spacer 4 may be made of an insulating dielectric material and surrounding the metal connection member 32. A confined air gap 5 may be formed within the spacer 4. The semiconductor device may be combined with additional one or more layers. For example, without limiting this inventive concept, the device may be combined with another substrate 1, as shown in FIG. 1.

The substrate 1 may made of any suitable semiconductor material such as silicon, germanium, silicon-germanium, silicon carbide, gallium arsenide, etc.

The first insulating dielectric layer 21 and the second insulating dielectric layer 22 may be made of materials including, but not limited to, $SiO_2$, SiN, SiON, etc. The first insulating dielectric layer 21 may include a first portion 211 and a second portion 212 stacked on the first portion 211.

The first connecting pad 31 of the metal conductor 3 may be disposed between the first portion 211 and the second portions 212 of the first insulating dielectric layer 21. The second connecting pad 33 may be disposed within the second insulating dielectric layer 22. The metal connection member 32 may penetrate through the substrate 1 and connect the first connecting pad 31 and the second connecting pad 33. The metal conductor 3 may be made of a metallic material including, but not limited to, tungsten, copper, aluminum, silver, platinum or alloys thereof. The first connecting pad 31, the metal connection member 32 and the second connecting pad 33 may be made of a same metallic material or of different metallic materials.

The spacer 4 may be made of an insulating dielectric material including, but not limited to, $SiO_2$, SiN, SiON.

In the semiconductor device of this inventive concept, the interconnection structure of the semiconductor device includes an air gap, which may effectively reduce the parasitic capacitance of the semiconductor device and thus reduce its RC delays. As a result, the operating speed and reliability of the semiconductor device may be greatly improved.

Based on the semiconductor device described above, this inventive concept further presents a semiconductor device manufacturing method. The semiconductor device of this inventive invention can be manufacturing using one of multiple possible methods. FIGS. 2A, 2B, 2C, 2D, 2E, 2F, 2G, 2H, 2I, 2J, 2K, 2L, and 2M are schematic cross-sectional views illustrating various stages of a semiconductor device manufacturing method in accordance with one or more embodiments of this inventive concept.

Figure 2A:
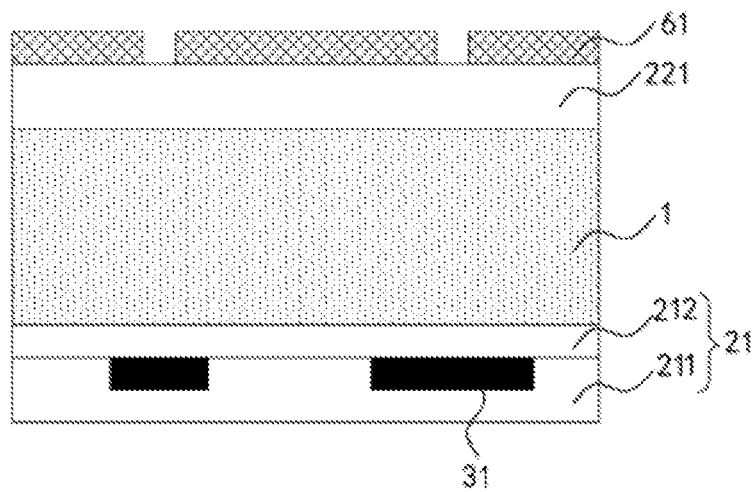
FIGS. 2A, 2B, 2C, 2D, 2E, 2F, 2G, 2H, 2I, 2J, 2K, 2L, and 2M are schematic cross-sectional views illustrating various stages of a semiconductor device manufacturing method in accordance with one or more embodiments of this inventive concept.

Referring to FIG. 2A, a patterned first mask layer 61 may be formed on a stacked structure consisting of a first portion 221 of a second insulating dielectric layer, a substrate 1 and a first insulating dielectric layer 21 containing a first connecting pad 31. The patterned first mask layer 61 may be formed on an upper surface of the first portion 221 of the second insulating dielectric layer, and may be a photoresist layer.

Figure 2B:
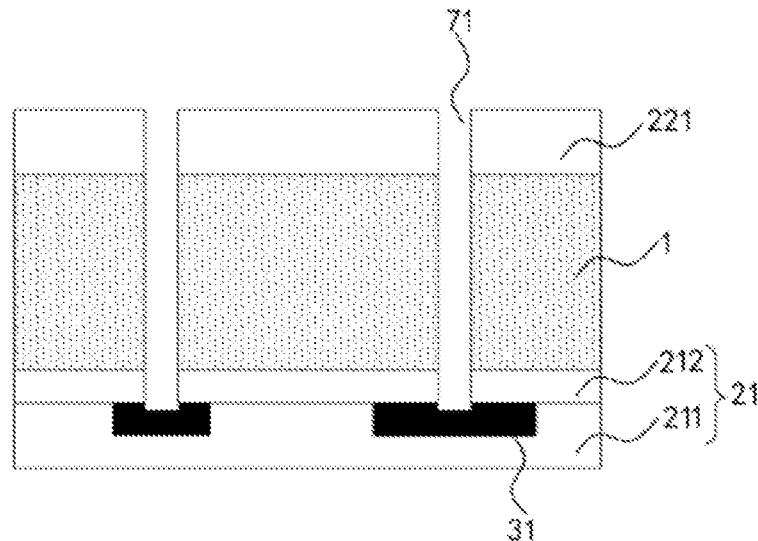

As shown in FIG. 2B, with the aid of the first mask layer 61, the first portion 221 of the second insulating dielectric layer, the substrate 1 and the first insulating dielectric layer 21 may be etched to form a via 71 exposing the first connecting pad 31. The etching may stop upon reaching an upper surface of the first connecting pad 31. Alternatively, the etching may stop upon reaching the interior of the first connecting pad 31. In the case illustrated in FIG. 2B, the etching stops at the interior of the first connecting pad 31 (hence the first connecting pad 31 is partially removed). This inventive concept, however, is not so limited, and those of ordinary skill in the art can make a suitable choice in this regard based on the actual conditions. The first mask layer 61 may be removed after the via 71 is formed.

Figure 2C:
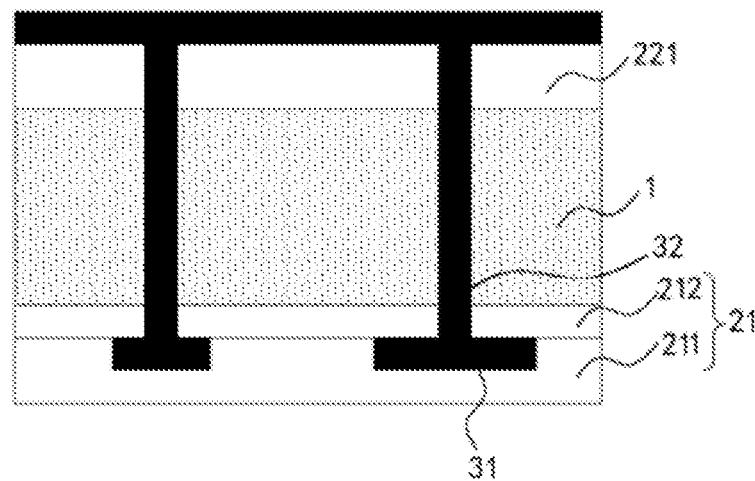
Figure 2D:
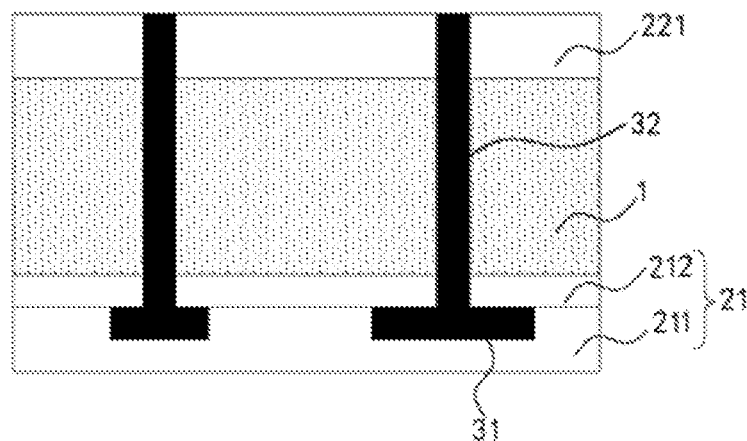

Subsequently, as shown in FIG. 2C, the via 71 may be filled with a metallic material. The filling may be accomplished by, for example, sputtering or electroplating, and the metallic material may be, for example, Cu. The filling may be performed until the upper surface of the first portion 221 of the second insulating dielectric layer is covered by the metallic material. After that, the metallic material deposited on the upper surface of the first portion 221 of the second insulating dielectric layer may be removed by, for example, chemical mechanical polishing (CMP) process, thereby exposing the upper surface of the first portion 221 of the second insulating dielectric layer, as shown in FIG. 2D. The metallic material deposited in the via 71 may form the metal connection member 32 of the metal conductor 3. The metal connection member 32 may connect the first connecting pad 31. The metal connection member 32 may be a TSV.

Figure 2E:
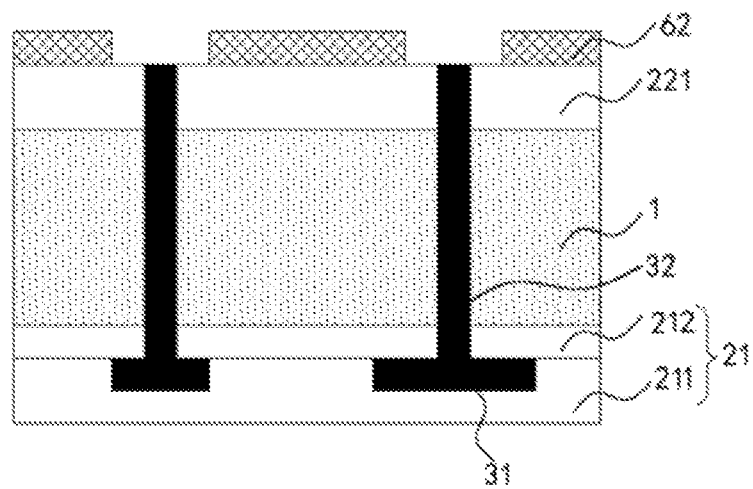

Next, as shown in FIG. 2E, a patterned second mask layer 62 may be formed on the upper surface of the first portion 221 of the second insulating dielectric layer. The second mask layer 62 may be a photoresist layer.

Figure 2F:
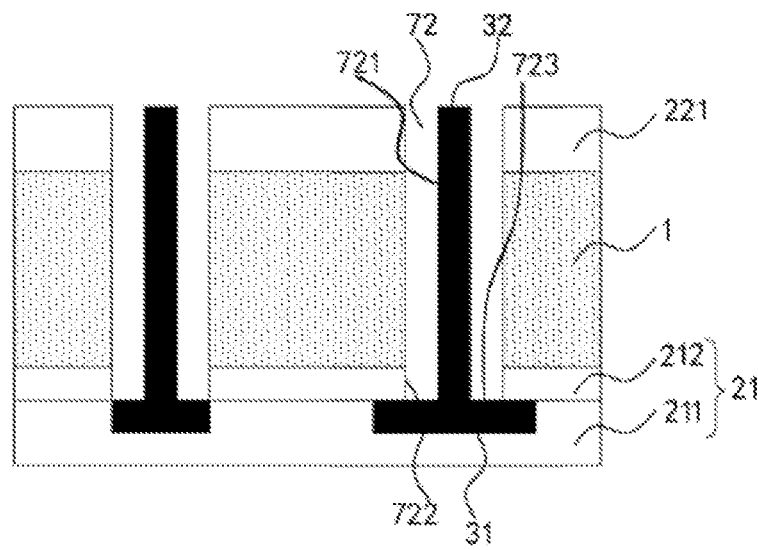

As shown in FIG. 2F, with the aid of the second mask layer 62, the first portion 221 of the second insulating dielectric layer, the substrate 1 and the second portion 212 of the first insulating dielectric layer 21 may be etched to form an annular hollow space 72 surrounding the metal connection member 32. The annular hollow space 72 may expose a surface of the first connecting pad 31, and an outer surface of the metal connection member 32, i.e., a first surface 721. The annular hollow space 72 may further expose a side wall, referred hereinafter as a second surface 722. The second surface 722 may extend through the second portion 212 of the first insulating dielectric layer, the substrate 1 and the first portion 221 of the second insulating dielectric layer. The surface of the first connecting pad 31 and, optionally, the surface of the first insulating dielectric layer that are exposed at the bottom of the annular hollow space 72 may be collectively referred to hereinafter as a bottom surface 723. The annular hollow space 72 may have a cross section in the shape of, for example, a circle or a polygon. The metal connection member 32 may also have a cross section in the shape of, for example, a circle or a polygon. A distance from the first surface 721 exposing the metal connection member 32 to the second surface 722, along a direction perpendicular to the first surface and the second surface, may be in a range of 0.1 μm to 5 μm.

Figure 2G:
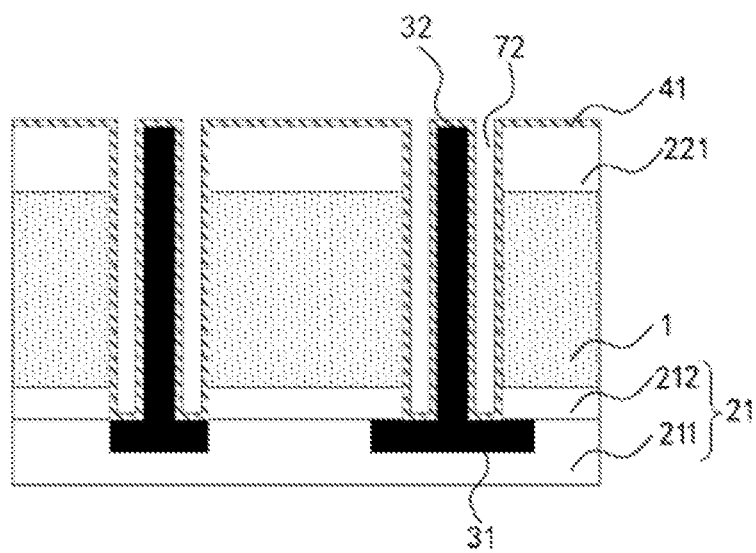

As shown in FIG. 2G, a dielectric liner layer 41 may be formed to cover the first surface 721, the second surface 722 and the bottom surface 723. The dielectric liner layer 41 may be made of a material such as SiN by, for example, atomic layer deposition (ALD).

Figure 2H:
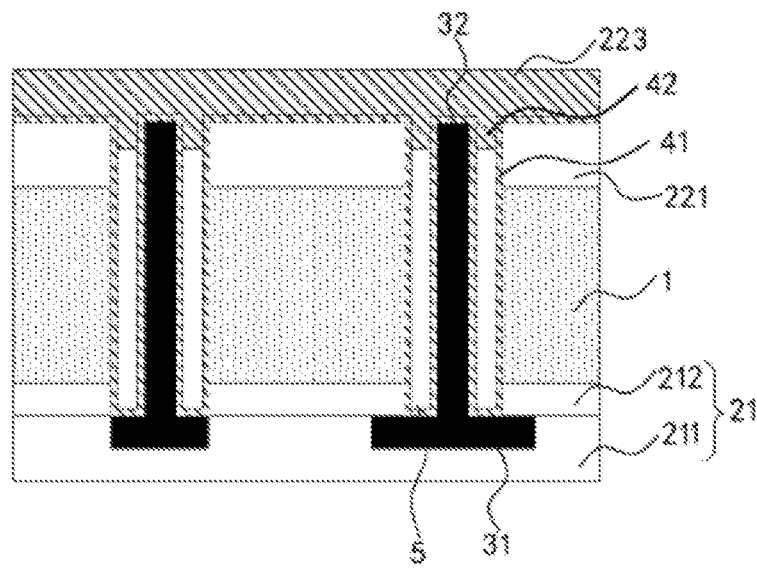
Figure 2I:
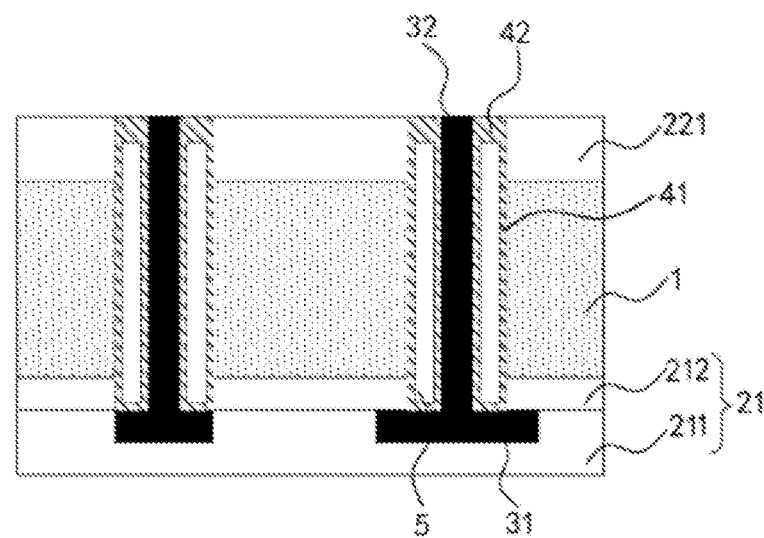

Afterward, a spacer 4 surrounding the metal connection member 32 and sealing the annular hollow space 72 may be formed. An air gap 5 may be confined within the spacer 4. The spacer 4 may have a surface flush with the upper surface of the first portion 221 of the second insulating dielectric layer and an upper surface of the metal connection member 32. For example, as shown in FIG. 2H, a third insulating dielectric layer 223 may be formed by depositing an insulating dielectric material by, for example, a plasma-enhanced chemical vapor deposition on the upper surface of the first portion 221 of the second insulating dielectric layer. An upper part of the annular hollow space 72 may be filled by the insulating dielectric material. A portion of the third insulating dielectric layer 223 that is deposited higher than the upper surface of the first portion 221 of the second insulating dielectric layer may be removed by, for example, a chemical mechanical polishing (CMP) process, so that the upper surface of the first portion 221 of the second insulating dielectric layer and the upper surface of the metal connection member 32 are exposed. A liner cover 42 formed by filling the upper part of the annular hollow space 72 with the insulating dielectric material may seal the annular hollow space 72, while the annular hollow space 72 may have the dielectric liner layer 41 covering the first surface 721, the second surface 722 and the bottom surface 723. As a result, the spacer 4 confining the air gap 5 may be formed. The third insulating dielectric layer 223 may be made of the same material as the dielectric liner layer 41 or a different material. While the third insulating dielectric layer 223 and the dielectric liner layer 41 are shown as being made of a same material in the drawings, this inventive concept is not so limited. The surface of the spacer 4 may be flush with the upper surface of the first portion 211 of the second insulating dielectric layer and the upper surface of the metal connection member 32, as shown in FIG. 2I.

Figure 2J:
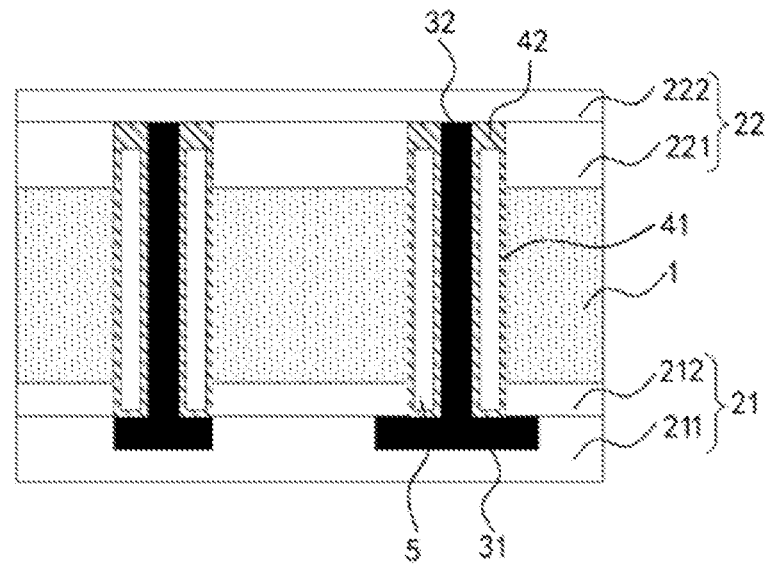

As shown in FIG. 2J, a second portion 222 of the second insulating dielectric layer may be deposited over the upper surfaces of the first portion 221 of the second insulating dielectric layer, the metal connection member 32 and a upper surface of the spacer 4 to cover the first portion 221 of the second insulating dielectric layer, the metal connection member 32 and the spacer 4. The second portion 222 of the second insulating dielectric layer may be made of the same material as the first portion 221 of the second insulating dielectric layer or a different material.

Figure 2K:
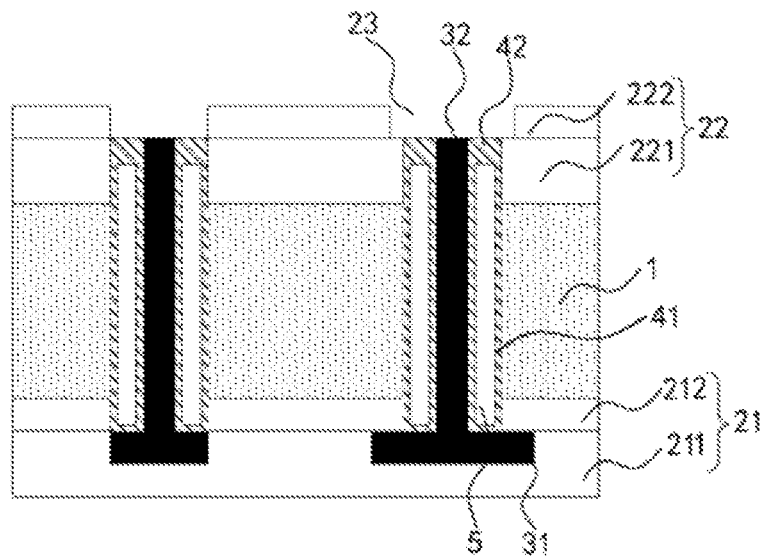

As shown in FIG. 2K, a trench 23 may be formed in the second portion 222 of the second insulating dielectric layer to expose the upper surfaces of the spacer 4 and the metal connection member 32.

Figure 2L:
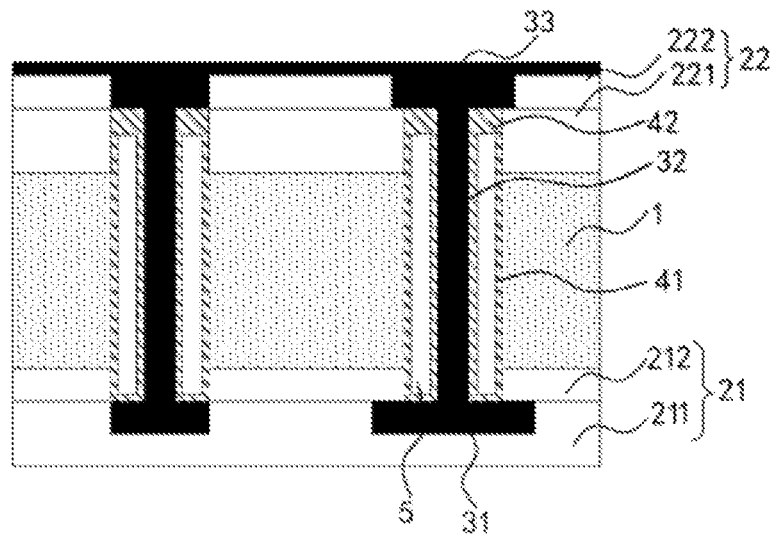
Figure 2M:
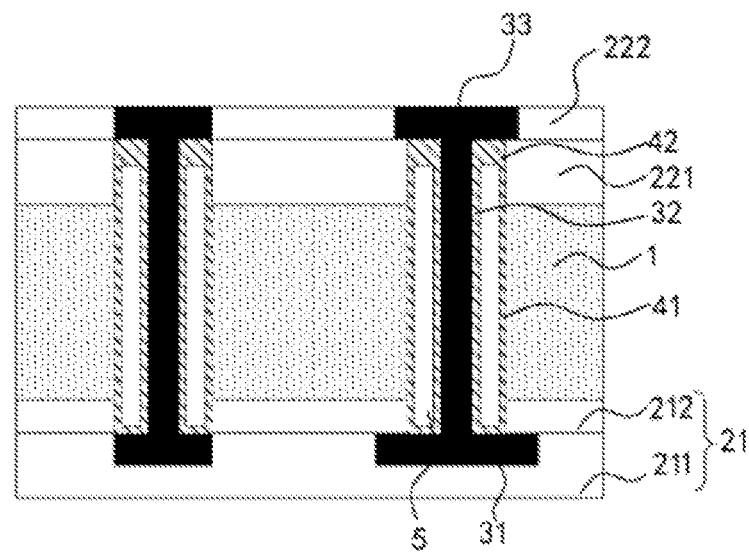

Finally, the trench 23 may be filled with a metallic material to form the second connecting pad 33 that connects the metal connection member 32. As such, the second connecting pad 33, the metal connection member 32 and the first connecting pad 31 may collectively constitute the metal conductor 3. As shown in FIG. 2L, the trench 23 may be filled with a metallic material such as Cu by, for example, sputtering or electroplating, until the metallic material covers the second portion 222 of the second insulating dielectric layer. Then the portion of the metallic material deposited higher than the upper surface of the second portion 222 of the second insulating dielectric layer may be removed by, for example, a CMP process, so that the upper surfaces of the second portion 222 of the second insulating dielectric layer and the second connecting pad 33 are exposed, as shown in FIG. 2M. In this embodiment, the first portion 221 and the second portion 222 of the second insulating dielectric layer may collectively constitute the second insulating dielectric layer 22 (as shown in FIG. 1).

FIGS. 3A, 3B, 3C, 3D, 3E, 3F, 3G, 3H, 3I, 3J, and 3K are schematic cross-sectional views illustrating various stages of a semiconductor device manufacturing method in accordance with one or more embodiments of this inventive concept. Steps in the method shown in FIGS. 3A to 3H are the same as corresponding steps shown in FIGS. 2A to 2H and thus will not be repeatedly described here.

Figure 3A:
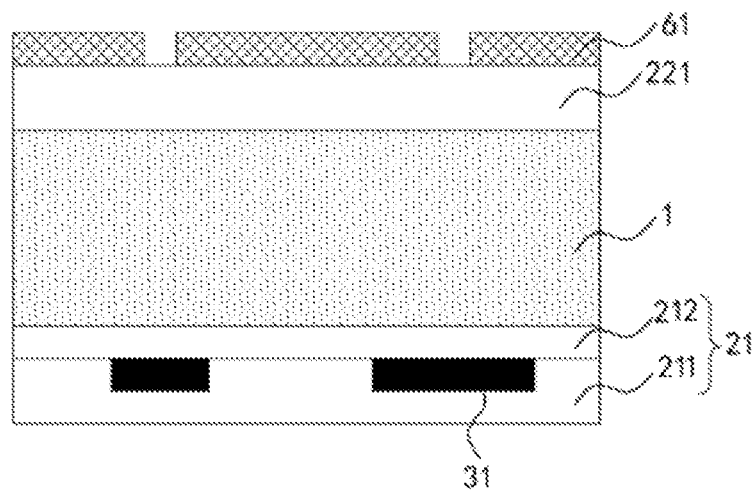
FIGS. 3A, 3B, 3C, 3D, 3E, 3F, 3G, 3H, 3I, 3J, and 3K are schematic cross-sectional views illustrating various stages of a semiconductor device manufacturing method in accordance with one or more embodiments of this inventive concept.
Figure 3B:
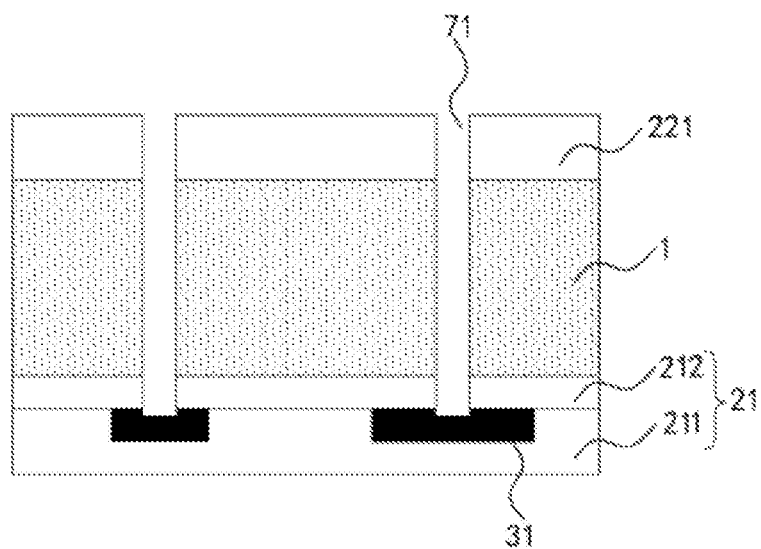
Figure 3C:
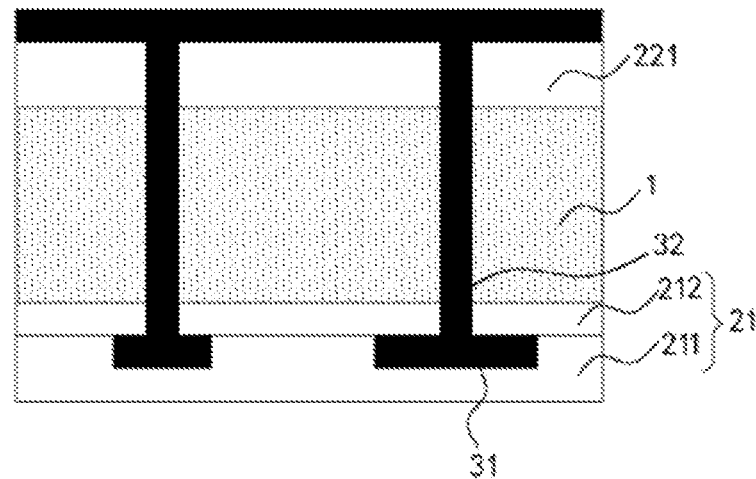
Figure 3D:
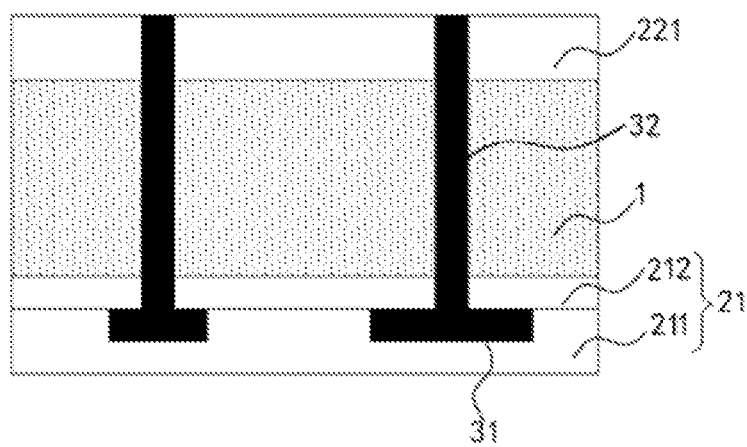
Figure 3E:
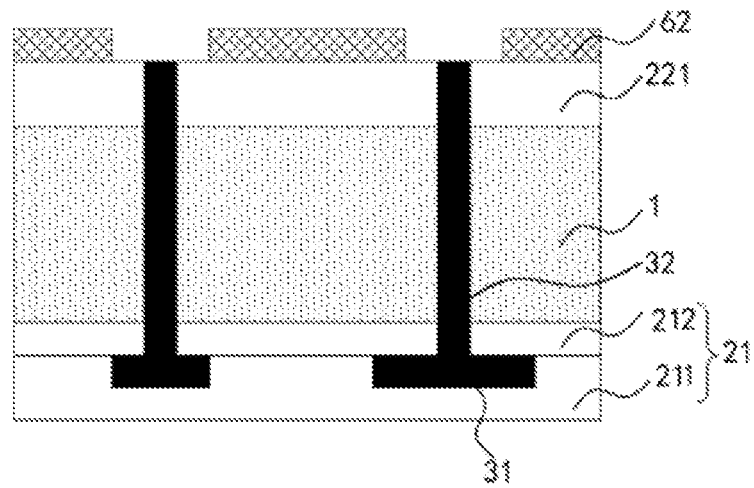
Figure 3F:
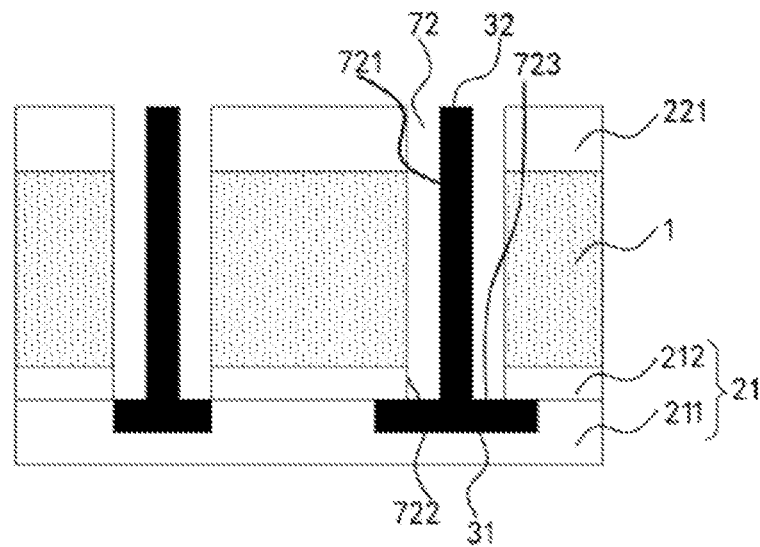
Figure 3G:
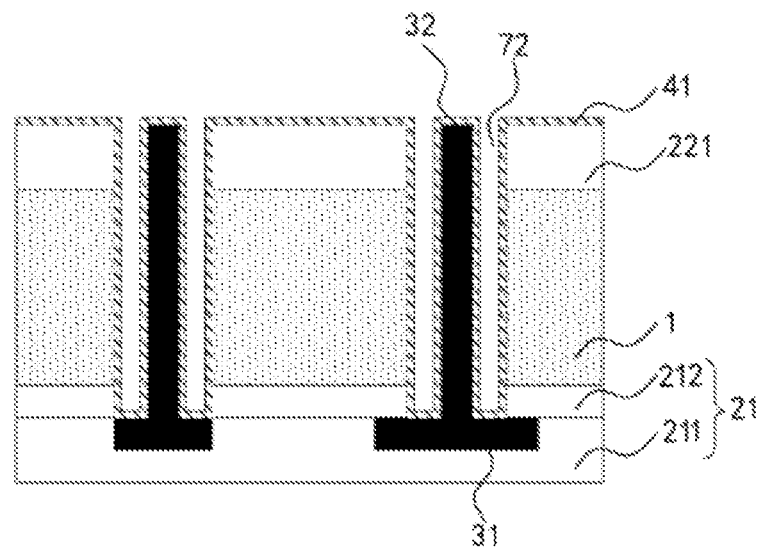
Figure 3H:
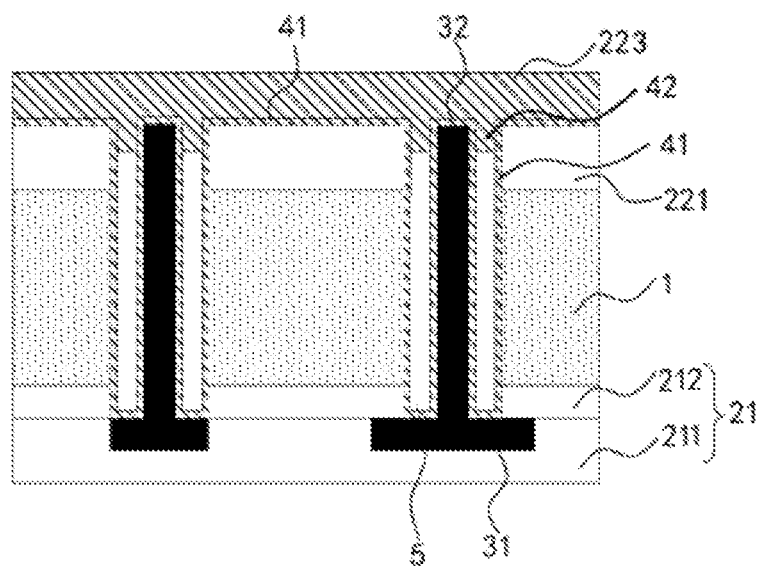
Figure 3I:
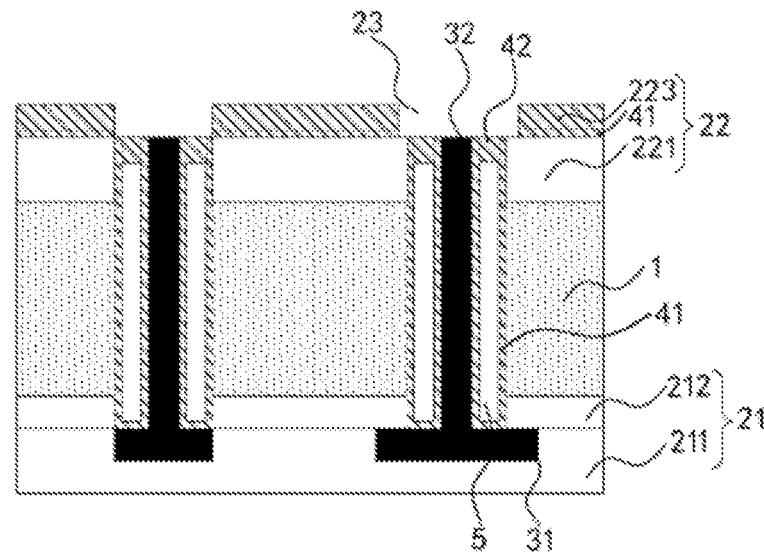

As shown in FIG. 3I, after the structure of FIG. 3H is formed, the third insulating dielectric layer 223 and the dielectric liner layer 41 may be partially removed by etching or other suitable methods to form a trench 23 to expose the upper surfaces of the spacer 4 and the metal connection member 32.

Figure 3J:
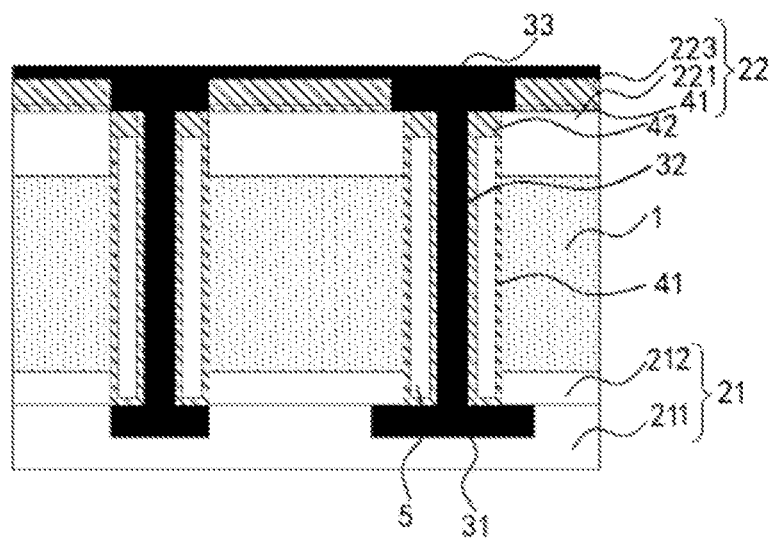
Figure 3K:
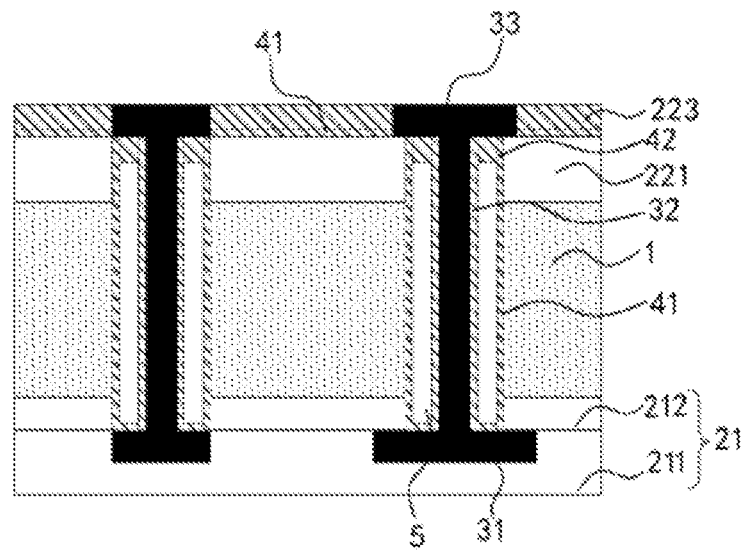

Then the trench 23 may be filled with a metallic material to form the second connecting pad 33 that connects the metal connection member 32. As such, the first connecting pad 31, the metal connection member 32 and the second connecting pad 33, may collectively constitute the metal conductor 3. As shown in FIG. 3J, the trench 23 may be filled with a metallic material such as Cu by, for example, sputtering or electroplating, until the metallic material covers the upper surface of the third insulating dielectric layer 223. Then, the portion of the metallic material deposited higher than the upper surface of the third insulating dielectric layer 223 may be removed by, for example, a CMP process to expose the third insulating dielectric layer 223 and second connecting pad 33, as shown in FIG. 3K. In this embodiment, the third insulating dielectric layer 223, the dielectric liner layer 41 and the first portion 221 of the second insulating dielectric layer may collectively constitute the second insulating dielectric layer 22 of the semiconductor device (as shown in FIG. 1).

FIGS. 4A, 4B, 4C, 4D, 4E, 4F, 4G, 4H, 4I, and 4J are schematic cross-sectional views illustrating various stages of a semiconductor device manufacturing method in accordance with one or more embodiments of this inventive concept. Steps in the method shown in FIGS. 4A to 4F are the same as corresponding steps shown in FIGS. 2A to 2F and thus will not be repeatedly described here.

Figure 4A:
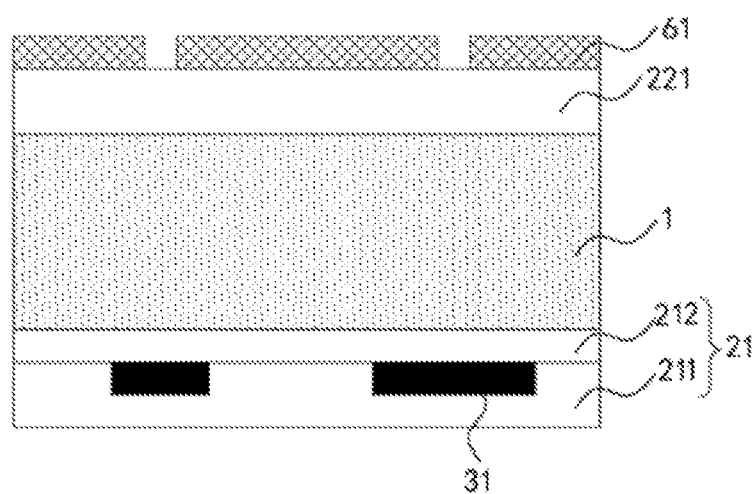
FIGS. 4A, 4B, 4C, 4D, 4E, 4F, 4G, 4H, 4I, and 4J are schematic cross-sectional views illustrating various stages of a semiconductor device manufacturing method in accordance with one or more embodiments of this inventive concept.
Figure 4B:
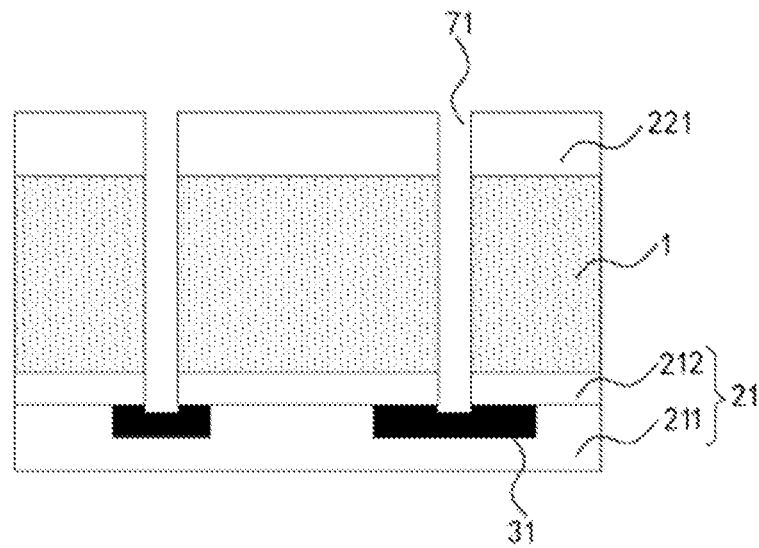
Figure 4C:
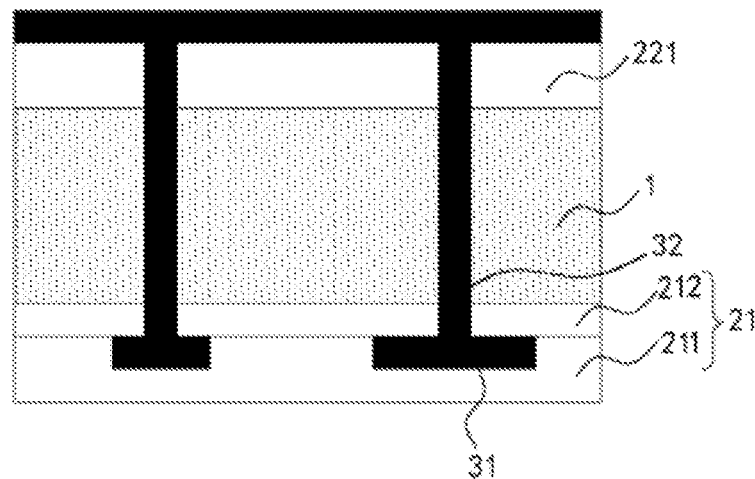
Figure 4D:
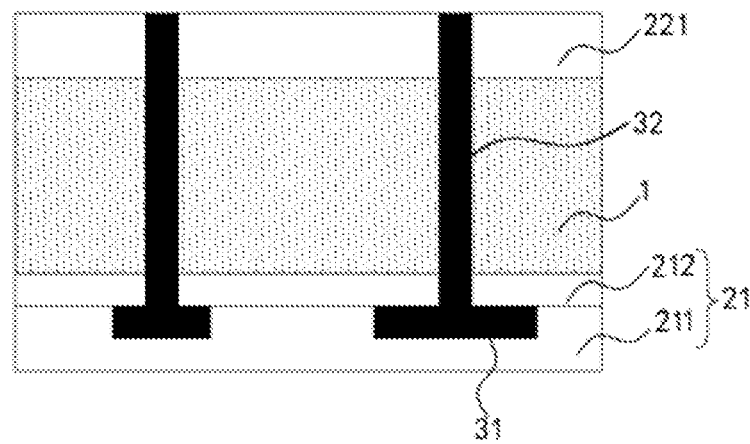
Figure 4E:
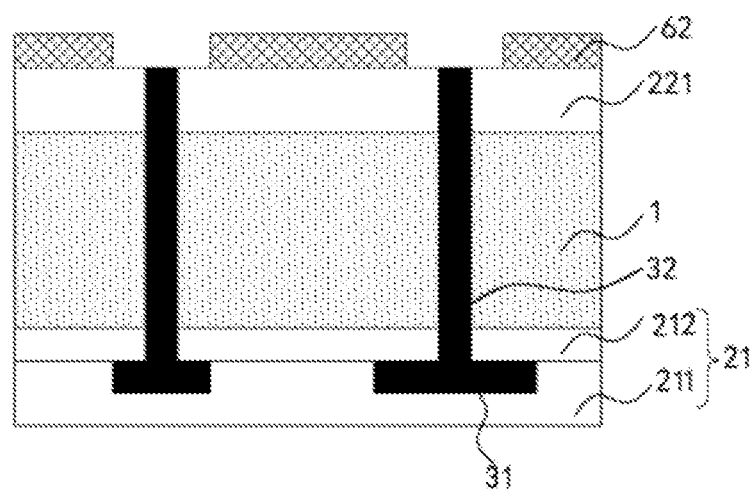
Figure 4F:
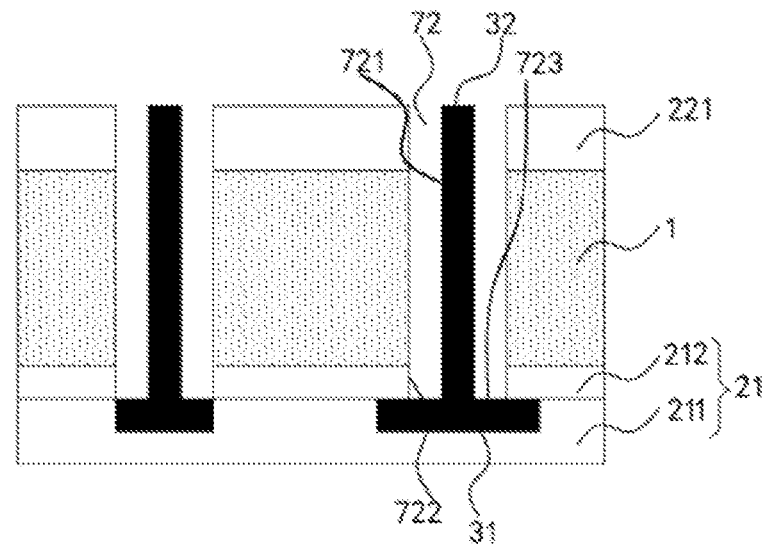
Figure 4G:
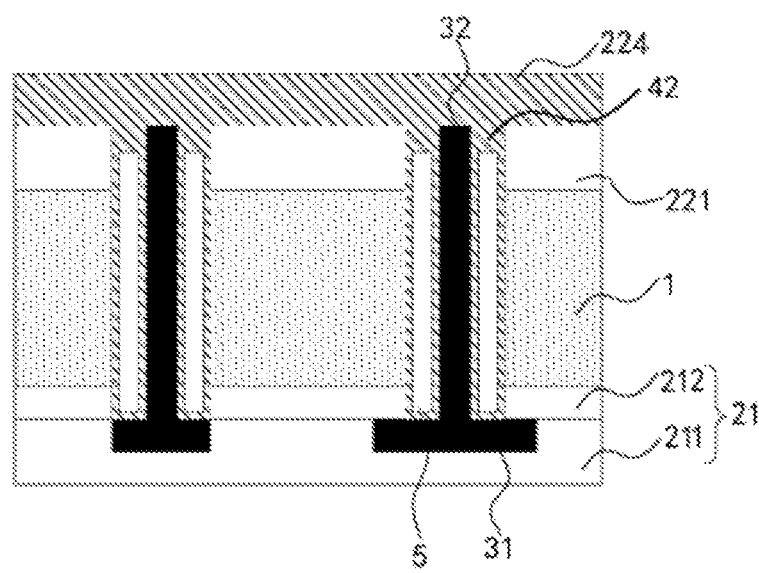

As shown in FIG. 4G, after the structure of FIG. 4F is formed, a dielectric layer 224 may be formed to cover the first surface 721, the second surface 722 and the bottom surface 723 (721, 722, and 723 shown in FIG. 4F). The dielectric liner layer 224 may be made of a material such as SiN by, for example, atomic layer deposition (ALD). After that, growth of the dielectric layer may continue until it closes the first surface 721, the second surface 722 and the bottom surface 723 so as to form the annular hollow space 72 comprising dielectric layers. The further grown insulating dielectric material at an upper part of the annular hollow space 72 may form the liner cover 42 to form the spacer 4. In this way, an air gap 5 may be confined within the spacer 4.

Figure 4H:
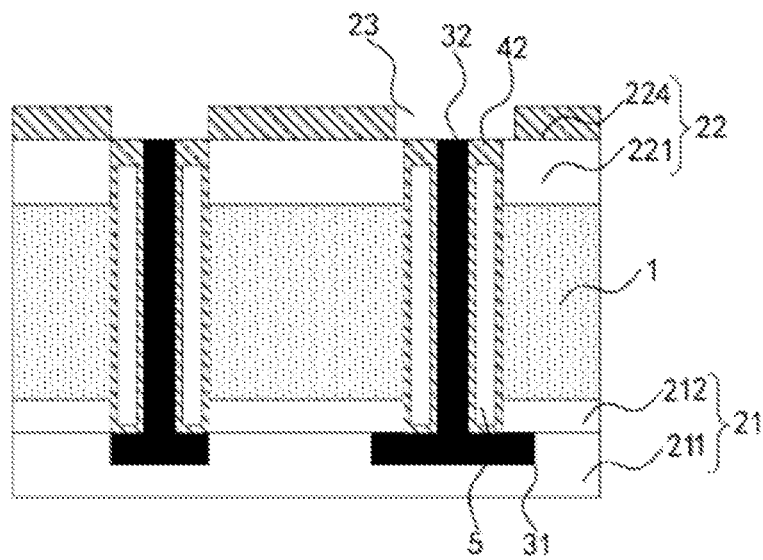

As shown in FIG. 4H, part of the dielectric layer 224 may be removed by etching or other suitable methods to form a trench 23 exposing the upper surfaces of the spacer 4 and the metal connection member 32.

Figure 4I:
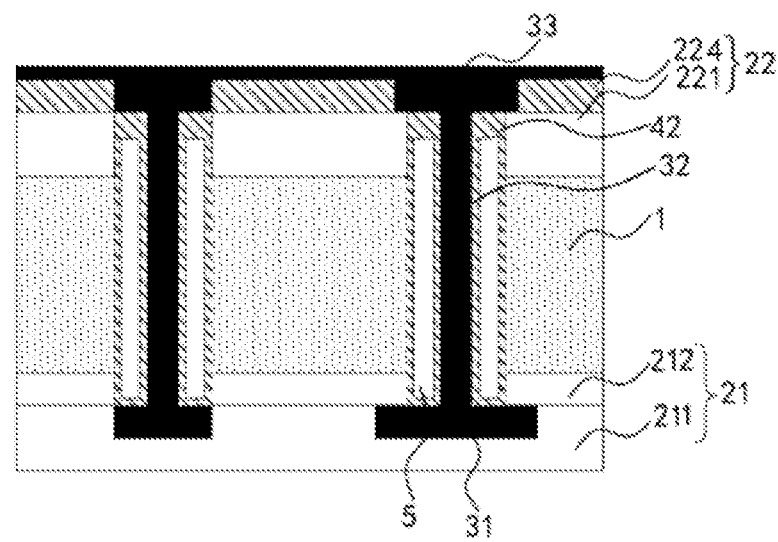
Figure 4J:
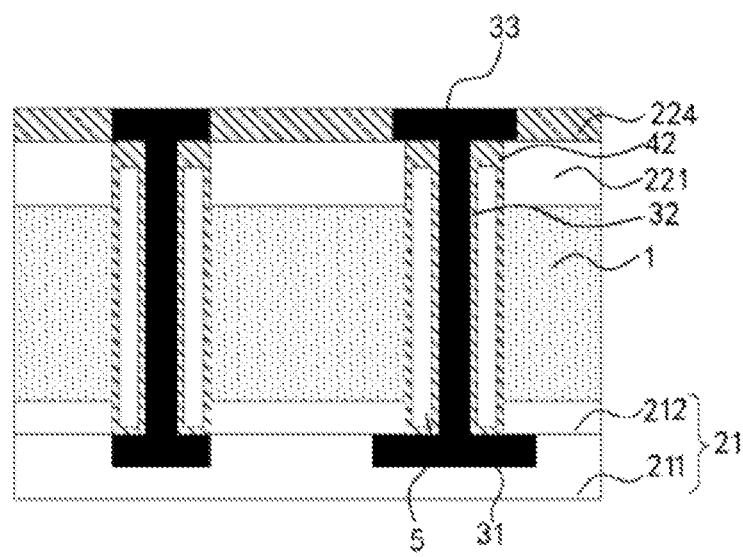

Then, the trench 23 may be filled with a metallic material to form the second connecting pad 33 that connects the metal connection member 32. As such, the first connecting pad 31, the metal connection member 32 and the second connecting pad 33, may collectively constitute the metal conductor 3. As shown in FIG. 4I, the trench 23 may be filled by a metallic material such as Cu by, for example, sputtering or electroplating, until the metallic material covers the dielectric layer 224. Then, the portion of the metallic material deposited higher than the upper surface of the dielectric layer 224 may be removed by, for example, a CMP process, to expose the underlying dielectric layer 224 and second connecting pad 33, as shown in FIG. 4J. In this embodiment, the dielectric layer 224 and the first portion 221 of the second insulating dielectric layer may collectively constitute the second insulating dielectric layer 22 of the semiconductor device (as shown in FIG. 1).

The semiconductor device manufactured using any of the aforementioned methods may include a uniform air gap, which helps to improve the reliability of the semiconductor device.

Other embodiments of the present disclosure will be apparent to those skilled in the art from considering the specification and practicing the invention disclosed herein. Accordingly, this disclosure is intended to cover all and any variations, uses, or adaptations of the disclosure which follow, in general, the principles thereof and include such departures from the present disclosure as come within common knowledge or customary practice within the art to which the invention pertains. It is also intended that the specification and examples be considered as exemplary only, with true scope and spirit of the disclosure being indicated by the appended claims.

It is to be understood that the present disclosure is not limited to the exact structures as described above and illustrated in the figures and may be modified or changed without departing from its scope. The scope of the disclosure is intended to be defined only by the appended claims.

The invention claimed is:

1. A semiconductor device, comprising at least one interconnection structure, wherein each of the at least one interconnection structure comprises:
   a substrate having an upper surface and a lower surface opposing the upper surface;
   a first insulating dielectric layer underneath the lower surface of the substrate;
   a second insulating dielectric layer on the upper surface of the substrate;
   a first connecting pad disposed within the first insulating dielectric layer;
   a metal connection member penetrating through a first portion of the second insulating dielectric layer, the substrate, and a second portion of the first insulating dielectric layer to connect the first connecting pad, the metal connection member surrounded by an annular hollow space having a first surface exposing the metal connection member, a second surface exposing the substrate, and a bottom surface;
   a dielectric liner layer, located within the annular hollow space and covering the first surface, the second surface and the bottom surface, the dielectric liner layer having a thickness that is smaller than half of a gap between the first surface and the second surface, thereby forming an air gap;
   a liner cover, located on the dielectric liner layer and hermetically closing the air gap that surrounds the metal connection member; and
   a second connecting pad disposed within the second insulating dielectric layer and on the liner cover, the second connecting pad connecting the metal connection member.

2. The semiconductor device of claim 1, wherein the substrate comprises one or more of silicon, germanium, silicon-germanium, silicon carbide and gallium arsenide.

3. The semiconductor device of claim 1, wherein the first insulating dielectric layer and the second insulating dielectric layer comprise one or more of silicon nitride, silicon dioxide and silicon oxynitride.

4. The semiconductor device of claim 1, wherein the first connecting pad, the metal connection member and the second connecting pad comprise one or more of tungsten, copper, aluminum, silver, platinum and alloys thereof.

5. The semiconductor device of claim 1, wherein the metal connection member is a Through-Silicon Via (TSV).

6. The semiconductor device of claim 1, wherein the annular hollow space penetrates through the first portion of the second insulating dielectric layer, the substrate, and the second portion of the first insulating dielectric layer.

7. The semiconductor device of claim 1, wherein a distance from the first surface to the second surface along a direction perpendicular to the first surface and the second surface ranges from 0.1 µm to 5 µm.

8. A semiconductor device manufacturing method, comprising:
providing a substrate having a lower surface and an upper surface opposing the lower surface, wherein a first insulating dielectric layer is disposed underneath the lower surface, a first connecting pad is disposed within the first insulating dielectric layer, and a second insulating dielectric layer is disposed on the upper surface;
disposing a metal connection member in the substrate, the metal connection member penetrating through a first portion of the second insulating dielectric layer, the substrate, and a second portion of the first insulating dielectric layer to connect the first connecting pad;
forming an annular hollow space surrounding the metal connection member, the annular hollow space having a first surface exposing the metal connection member, a second surface exposing the substrate, and a bottom surface;
forming a dielectric liner layer within the annular hollow space, the dielectric liner layer covering the first surface, the second surface and the bottom surface, and having a thickness that is smaller than half a gap between the first surface and the second surface along a direction perpendicular to the first surface and the second surface, thereby forming an air gap;
forming a liner cover on the dielectric liner to hermetically close the air gap, thereby forming a spacer surrounding the metal connection member; and
disposing a second connecting pad within the second insulating dielectric layer, on the liner cover and connecting the metal connection member.

9. The method of claim 8, wherein the disposing a metal connection member in the substrate comprises:
etching the first portion of the second insulating dielectric layer, the substrate and the second portion of the first insulating dielectric layer with an aid of a mask to form a via exposing an upper surface of the first connecting pad; and
depositing a metallic material within the via to form the metal connection member.

10. The method of claim 9, wherein the metallic material is deposited by sputtering or electroplating.

11. The method of claim 8, wherein the first connecting pad, the metal connection member and the second connecting pad comprise one or more of tungsten, copper, aluminum, silver, platinum, and alloys thereof.

12. The method of claim 8, wherein the metal connecting member is a Through-Silicon Via (TSV).

13. The method of claim 8, wherein the forming an annular hollow space comprises:
etching the first portion of the second insulating dielectric layer, the substrate and the second portion of the first insulating dielectric layer with an aid of a mask to form the annular hollow space surrounding the metal connection member, the annular hollow space exposing an upper surface of the first connecting pad.

14. The method of claim 8, wherein a distance from the first surface to the second surface along a direction perpendicular to the first surface and the second surface ranges from 0.1 µm to 5 µm.

15. The method of claim 8, wherein the dielectric liner layer is formed by atomic layer deposition (ALD).

16. The method of claim 8, wherein the liner cover is formed by depositing an insulating dielectric material over an upper part of the annular hollow space, so as to close the annular hollow space having the dielectric liner layer covering the first surface, the second surface and the bottom surface.

17. The method of claim 16, wherein the liner cover is formed by depositing the insulating dielectric material by plasma enhanced chemical vapor deposition (PECVD).

18. The method of claim 8, wherein the spacer comprises one or more of silicon nitride, silicon dioxide and silicon oxynitride.

19. A semiconductor device manufacturing method, comprising:
providing a substrate having a lower surface and an upper surface opposing the lower surface, wherein a first insulating dielectric layer is disposed underneath the lower surface, a first connecting pad is disposed within the first insulating dielectric layer, and a second insulating dielectric layer is disposed on the upper surface;
disposing a metal connection member in the substrate, the metal connection member penetrating through a first portion of the second insulating dielectric layer, the substrate, and a second portion of the first insulating dielectric layer to connect the first connecting pad;
forming an annular hollow space surrounding the metal connection member, the annular hollow space having a first surface exposing the metal connection member, a second surface exposing the substrate, and a bottom surface;
forming a dielectric layer within the annular hollow space to cover the first surface, the second surface and the bottom surface, and continuing to grow the dielectric layer to form a liner cover to close the annular hollow space, thereby forming an spacer which confines an air gap and surrounds the metal connection member; and
disposing a second connecting pad within the second insulating dielectric layer, the second connecting pad located on the liner cover and connecting the metal connection member.

20. The method of claim 19, wherein the first connecting pad, the metal connection member and the second connecting pad comprise one or more of tungsten, copper, aluminum, silver, platinum, and alloys thereof, and wherein the metal connection member is a Through-Silicon Via (TSV).

* * * * *